US007413931B2

(12) United States Patent
Noma et al.

(10) Patent No.: US 7,413,931 B2
(45) Date of Patent: Aug. 19, 2008

(54) SEMICONDUCTOR DEVICE MANUFACTURING METHOD

(75) Inventors: Takashi Noma, Gunma (JP); Kazuo Okada, Gunma (JP); Hiroshi Yamada, Gunma (JP); Masanori Iida, Gunma (JP)

(73) Assignee: SANYO Electric Co., Ltd., Osaka (JP)

( * ) Notice: Subject to any disclaimer, the term of this patent is extended or adjusted under 35 U.S.C. 154(b) by 236 days.

(21) Appl. No.: 11/225,898

(22) Filed: Sep. 14, 2005

(65) Prior Publication Data

US 2006/0068572 A1   Mar. 30, 2006

(30) Foreign Application Priority Data

Sep. 24, 2004   (JP) .............................. 2004-276307

(51) Int. Cl.
*H01L 21/312* (2006.01)
(52) U.S. Cl. ...................... 438/114; 438/465; 257/701; 257/E21.01
(58) Field of Classification Search ................. 438/114, 438/465, 928; 257/E21.01
See application file for complete search history.

(56) References Cited

U.S. PATENT DOCUMENTS

| 6,646,289 | B1 | 11/2003 | Badehi |
| 7,067,354 | B2 * | 6/2006 | Prabhu ........................ 438/113 |
| 2002/0119652 | A1 * | 8/2002 | Hill ............................ 438/624 |
| 2003/0230805 | A1 | 12/2003 | Noma et al. |
| 2004/0110316 | A1 * | 6/2004 | Ogihara et al. ................ 438/26 |
| 2004/0161920 | A1 | 8/2004 | Noma |
| 2004/0248343 | A1 * | 12/2004 | Brintzinger et al. ......... 438/125 |

FOREIGN PATENT DOCUMENTS

| CN | 1453865 A | 11/2003 |
| EP | 1429377 A2 | 6/2004 |
| EP | 1482552 A2 | 12/2004 |
| JP | 2000-91339 A | 3/2000 |
| JP | 2002-512436 | 4/2002 |
| WO | WO-99/40624 A1 | 8/1999 |

OTHER PUBLICATIONS

European Search Report mailed Feb. 13, 2006, directed to EP 05020906.3.

* cited by examiner

*Primary Examiner*—Asok K. Sarkar
*Assistant Examiner*—Emily Rohm
(74) *Attorney, Agent, or Firm*—Morrison & Foerster LLP (57) ABSTRACT

The invention is directed to improvement of reliability of a chip size package type semiconductor device in a manufacturing method thereof. A support body is formed on a front surface of a semiconductor substrate with a first insulation film therebetween. Then, a part of the semiconductor substrate is selectively etched from its back surface to form an opening, and then a second insulation film is formed on the back surface. Next, the first insulation film and the second insulation film at a bottom of the opening are selectively etched, to expose pad electrodes at the bottom of the opening. Then, a third resist layer is selectively formed on a second insulation film at boundaries between sidewalls and the bottom of the opening on the back surface of the semiconductor substrate. Furthermore, a wiring layer electrically connected with the pad electrodes at the bottom of the opening and extending onto the back surface of the semiconductor substrate is selectively formed corresponding to a predetermined pattern.

6 Claims, 14 Drawing Sheets

SEMICONDUCTOR DEVICE MANUFACTURING METHOD

CROSS-REFERENCE OF THE INVENTION

This invention is based on Japanese Patent Application No. 2004-276307, the content of which is incorporated by reference in its entirety.

BACKGROUND OF THE INVENTION

1. Field of the Invention

This invention relates to a semiconductor device manufacturing method, particularly, a method of manufacturing a chip size package type semiconductor device.

2. Description of the Related Art

CSP (Chip Size Package) has received attention in recent years as a packaging technology. The CSP means a small package having almost the same outside dimensions as those of a semiconductor die packaged in it. Conventionally, BGA (ball grid array) type semiconductor devices have been known as a kind of CSP type semiconductor devices. In this BGA type semiconductor device, a plurality of ball-shaped conductive terminals is arrayed in a grid pattern on one surface of the package, being electrically connected with pad electrodes of the semiconductor die. When this BGA type semiconductor device is mounted on electronic equipment, the semiconductor die is electrically connected with an external circuit on a printed circuit board by compression bonding of the ball-shaped conductive terminals to wiring patterns on the printed circuit board.

Such a conventional BGA type semiconductor device is manufactured by a following manufacturing method, for example.

First, a semiconductor substrate sectioned by a dicing line is prepared. Electronic devices are formed on a front surface of the semiconductor substrate. Then, pad electrodes connected with the electronic devices are formed on the front surface of the semiconductor substrate. Furthermore, a support body is formed on the front surface of the semiconductor substrate. Then, openings are formed along the dicing line by selectively etching a part of the semiconductor substrate from its back surface. A wiring layer is then formed, being electrically connected with the pad electrodes exposed in the openings and extending from an inside of the openings onto the back surface of the semiconductor substrate. Furthermore, the wiring layer is selectively etched to form a predetermined wiring pattern. Then, a protection layer exposing a part of the wiring layer is formed on the back surface of the semiconductor substrate including on the wiring layer, and conductive terminals are formed on a part of the wiring layer. Finally, the semiconductor substrate is separated into a plurality of semiconductor dies by dicing along the dicing line.

The relevant technology is disclosed in the Japanese Patent Application Publication No. 2002-512436.

Figure 14:
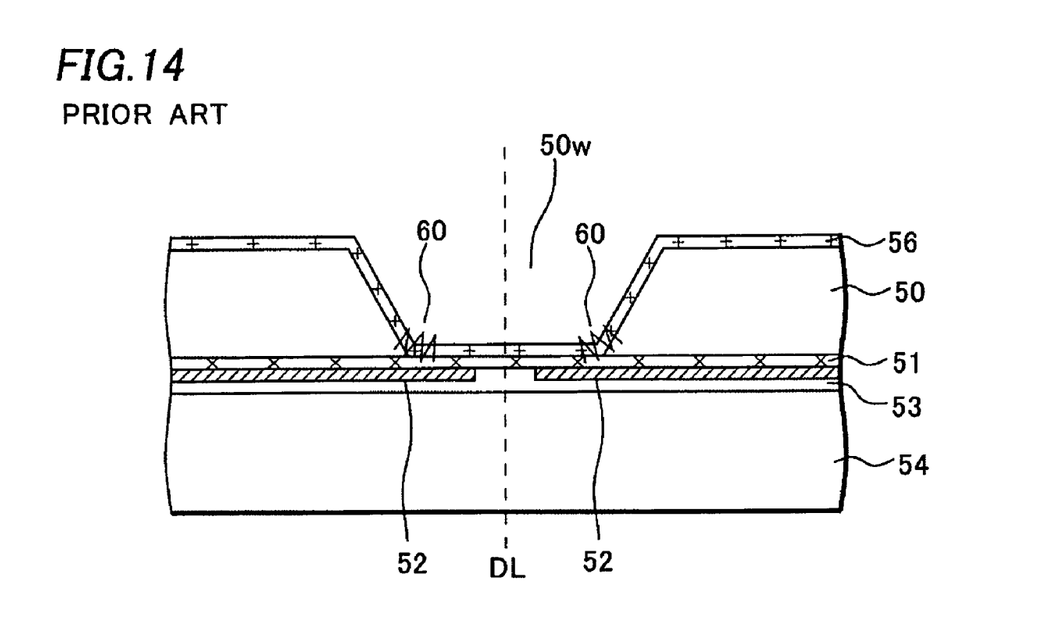
FIG. 14 is a cross-sectional view showing a semiconductor device manufacturing method of a conventional art.

FIG. 14 is a cross-sectional view showing one of processes of a method of manufacturing the above described semiconductor device. As shown in FIG. 14, pad electrodes 52 are formed on a front surface of a semiconductor substrate 50 with a first insulation film 51 therebetween. Furthermore, a support body 54 is formed on the front surface of the semiconductor substrate 50 including on the pad electrodes 52 with a resin layer 53 therebetween. An opening 50w is formed along a dicing line DL.

In the opening 50w formed on a back surface of the semiconductor substrate 50, however, damages, such as cracks 60, occur to a second insulation film 56 on the back surface. These cracks 60 are caused by the stress applied to the opening 50w by the semiconductor substrate 50 that is distorted when the substrate 50 is handled.

When the damage such as the cracks 60 occurs to the second insulation film 56, a solution such as etchant used in subsequent processes infiltrates therein. This causes a problem that the pad electrodes 52 formed near the second insulation film 56 and other portions of the semiconductor substrate 50 corrode away. As a result, the reliability of the semiconductor device lowers.

SUMMARY OF THE INVENTION

The invention provides a method of manufacturing a semiconductor device. The method includes providing a semiconductor substrate having a first surface and a second surface, attaching a support body to the first surface, forming a hole in the semiconductor substrate from the second surface, forming an insulation film to cover at least part of the second surface, at least part of a sidewall of the hole and at least part of a bottom of the hole, forming a protection layer to cover at least a portion of the insulation film corresponding to a boundary between the covered sidewall of the hole and the covered bottom of the hole, and forming a wiring layer that is disposed on the second surface and extends into the hole.

The invention also provides another method of manufacturing a semiconductor device. The method includes providing a semiconductor substrate having a front surface, a back surface, a first insulation film disposed on the front surface and a pad electrode disposed on the first insulation film, attaching a support body to the front surface, and forming an opening in the semiconductor substrate and adjacent the pad electrode by etching the semiconductor substrate from the back surface. This opening has a bottom and a sidewall. The method further includes forming a second insulation film that is disposed on the back surface and extends into the opening, etching the first and second insulation films disposed at the bottom of the opening to expose part of the pad electrode, forming a first protection layer that is disposed on the second surface and extends into the opening so as to cover a portion of the second insulation film corresponding to a boundary between the sidewall and the bottom of the opening, and forming a wiring layer that is disposed on the back surface and extends into the opening so as to be in contact with the exposed pad electrode. Part of the wiring layer is disposed on the first protection layer.

BRIEF DESCRIPTION OF THE DRAWINGS

FIGS. 2A to 3B, 5A to 8B, 10A, 10B, and 12A to 13B are cross-sectional views showing the semiconductor device manufacturing method of the embodiment of the invention.

DETAILED DESCRIPTION OF THE INVENTION

A semiconductor device manufacturing method of a first embodiment of the invention will be described with reference to the drawings. FIGS. 1, 4, 9 and 11 are plan views showing a semiconductor device manufacturing method of the embodiment. FIGS. 2A to 3B, 5A to 8B, 10A, 10B, and 12A to 13B are cross-sectional views showing the semiconductor device manufacturing method of the embodiment.

It is noted that FIGS. 1 to 13B show a portion of the semiconductor substrate near a dicing line DL1 and a dicing line DL2 perpendicularly crossing the line DL1 which will be described below. A dicing line may be a line physically scribed on a surface of a semiconductor substrate, for example, by etching, or a virtual line defined by physical landmarks, such as alignment marks, formed on a surface of a semiconductor substrate. In this embodiment, the dicing of the semiconductor substrate is performed based on the scribed lines on the front surface of the semiconductor substrate or the virtual lines on the back surface of the semiconductor substrate.

Figure 1:
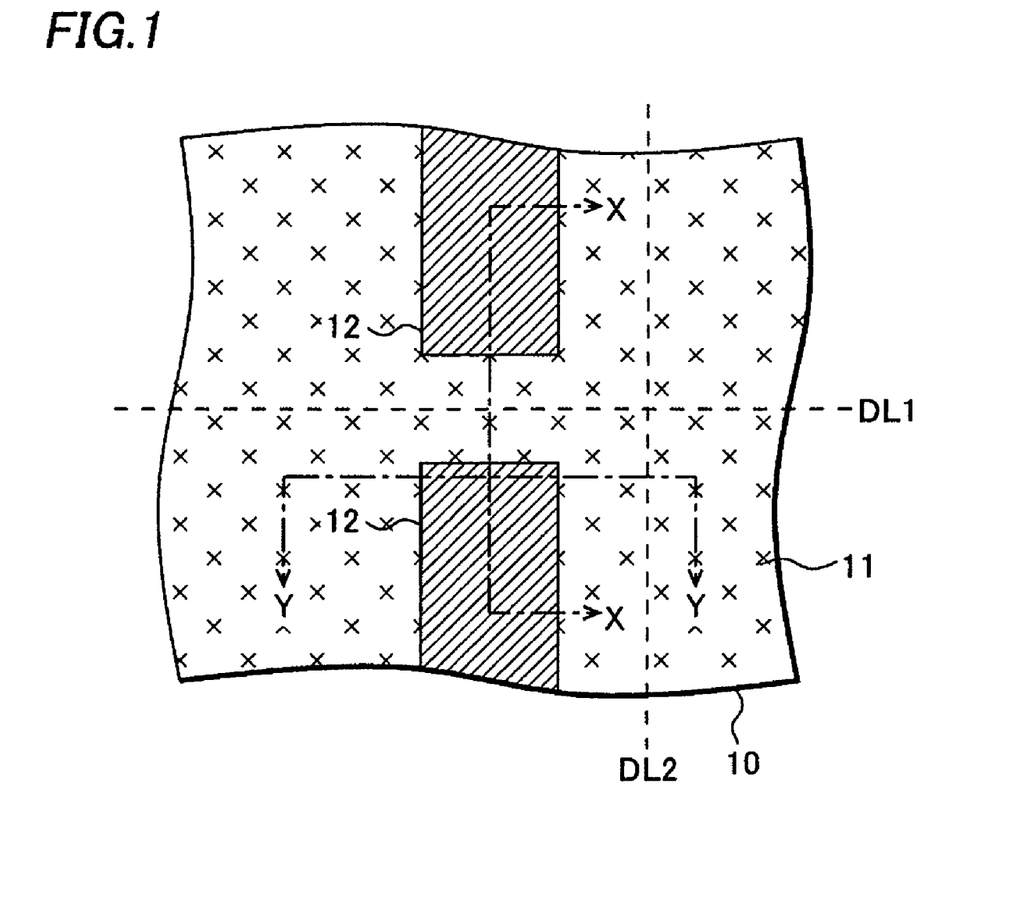
FIGS. 1, 4, 9, and 11 are plan views showing a semiconductor device manufacturing method of an embodiment of the invention.
Figure 4:
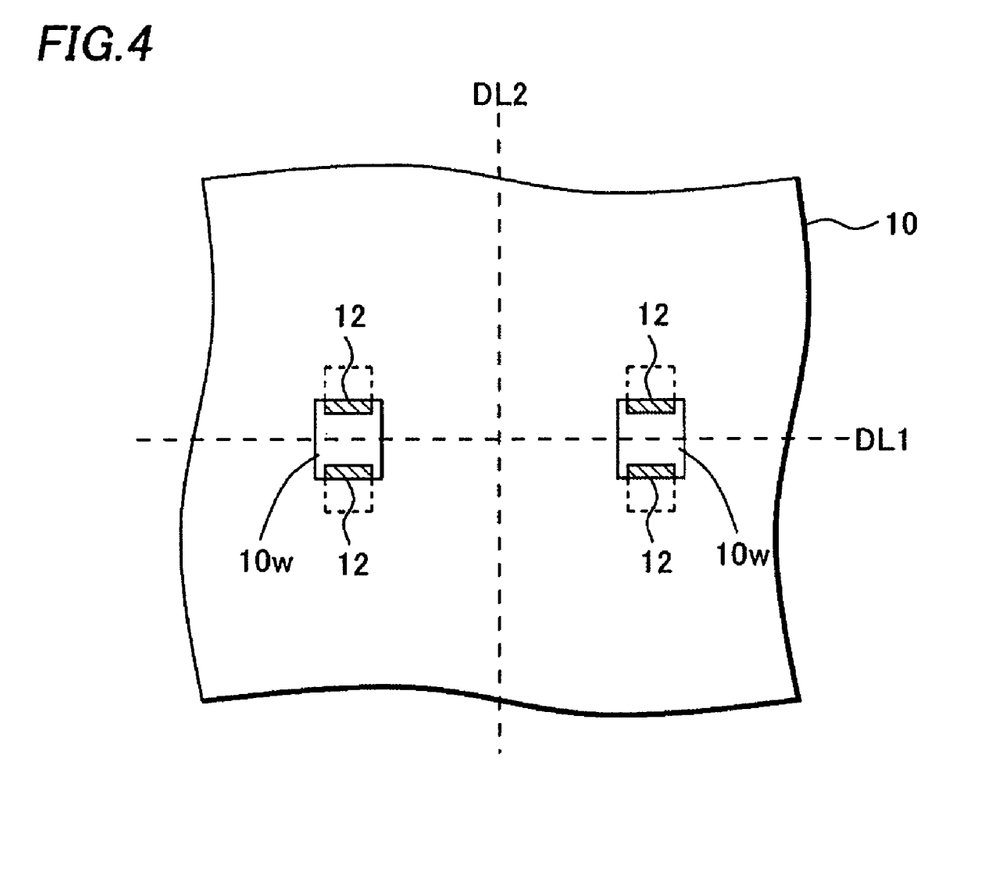
Figure 9:
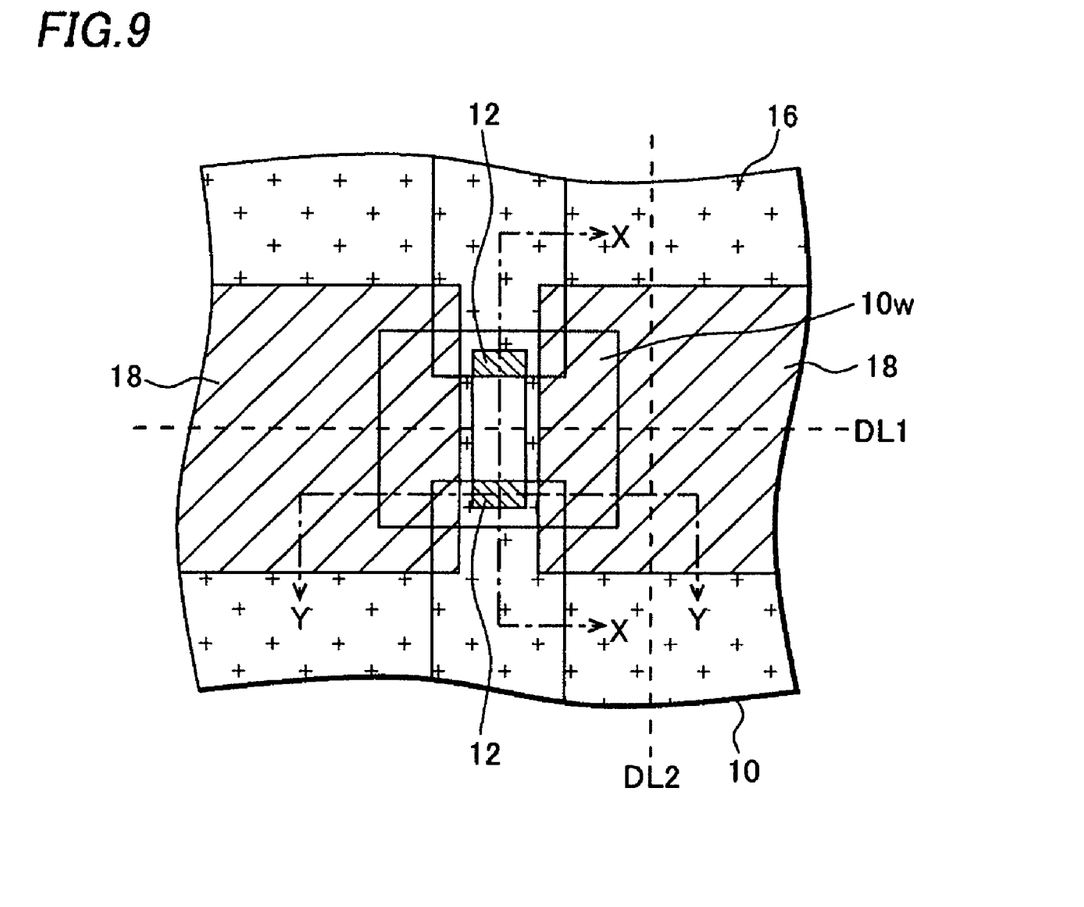
Figure 11:
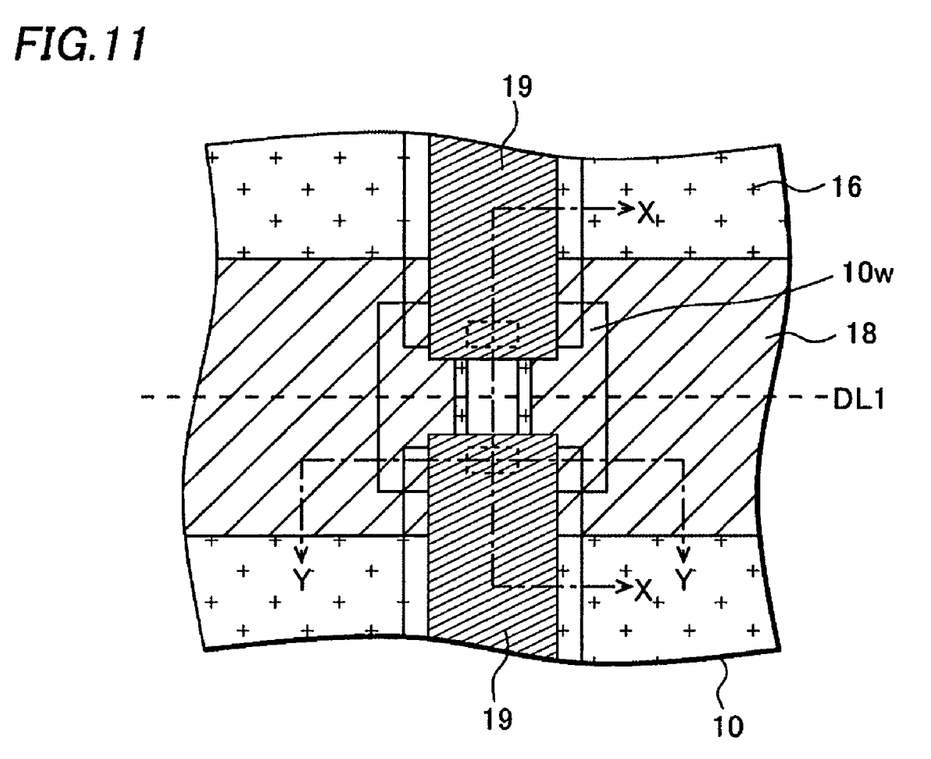

FIG. 1 is a plan view of a semiconductor substrate 10, showing its front surface. FIGS. 4, 9, and 11 are plan views of the semiconductor substrate 10, showing its back surface.

First, as shown in FIG. 1, the semiconductor substrate 10 sectioned by the dicing line DL1 and the dicing line DL2 perpendicularly crossing the line DL1 is prepared. Electronic devices (not shown) are formed on the front surface of the semiconductor substrate 10. The electronic devices are light receiving elements such as CCD (charge coupled device) or an infrared ray sensor, or light emissive elements, for example. Alternatively, the electronic devices can be other ones than the light receiving elements or the light emissive elements. The semiconductor substrate 10 is formed of a silicon substrate, for example, but can be formed of the other material.

Then, pad electrodes 12 connected with the electronic devices are formed on the front surface of the semiconductor substrate 10 with a first insulation film 11 as an interlayer insulation film therebetween. In this embodiment, a pair of the pad electrodes 12 is placed on both sides of the dicing line DL1 with each having a similar separation form the dicing line DL1. The first insulation film 11 is formed of a P-TEOS film, a BPSG film or the like, for example. The pad electrodes 12 are preferably formed of aluminum (Al) by a sputtering method, but can be formed of other metal.

Next, a substrate-like or tape-like support body 14 is attached to the front surface of the semiconductor substrate 10 including on the pad electrodes 12 with a resin layer 13 therebetween. In the case that the electronic devices are the light receiving elements or the light emissive elements, the support body 14 is formed of a transparent or semitransparent material such as a glass. When the electronic devices are not the light receiving elements or the light emissive elements, the support body 14 is not necessarily formed of a transparent or semitransparent material.

Figure 2A:
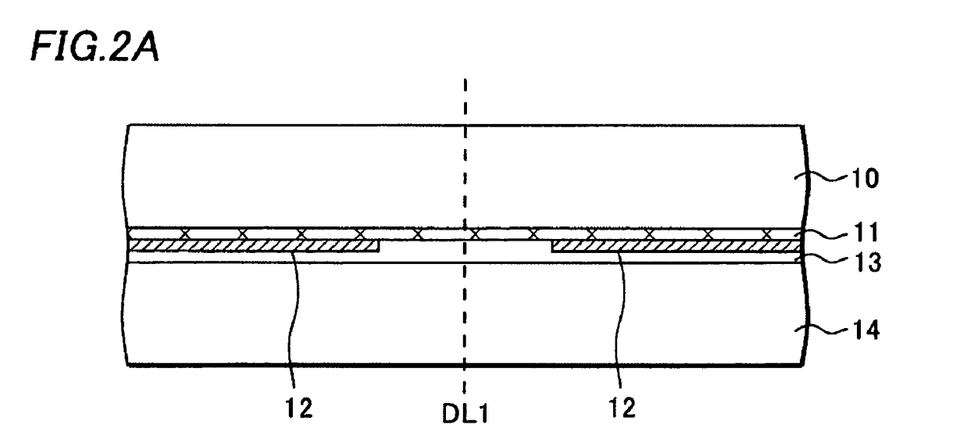
Figure 2B:
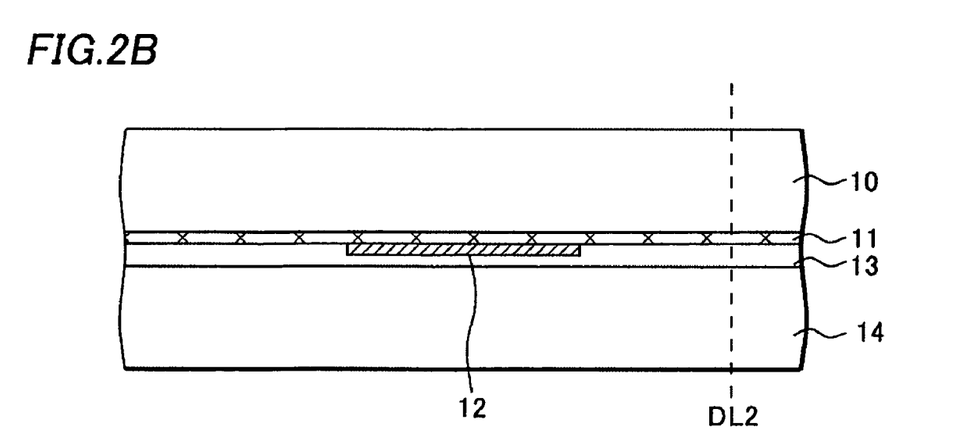

Cross-sectional views of the semiconductor substrate 10 and the layers laminated thereon described above are shown in FIGS. 2A and 2B. FIG. 2A is a cross-sectional view along line X-X of FIG. 1. FIG. 2B is a cross-sectional view along line Y-Y of FIG. 1. FIGS. 3A, 5A, 6A, 7A, 8A, 10A, 12A, and 13A are cross-sectional views along line X-X of FIG. 1. FIGS. 3B, 5B, 6B, 7B, 8B, 10B, 12B, and 13B are cross-sectional views along line Y-Y of FIG. 1.

Figure 3A:
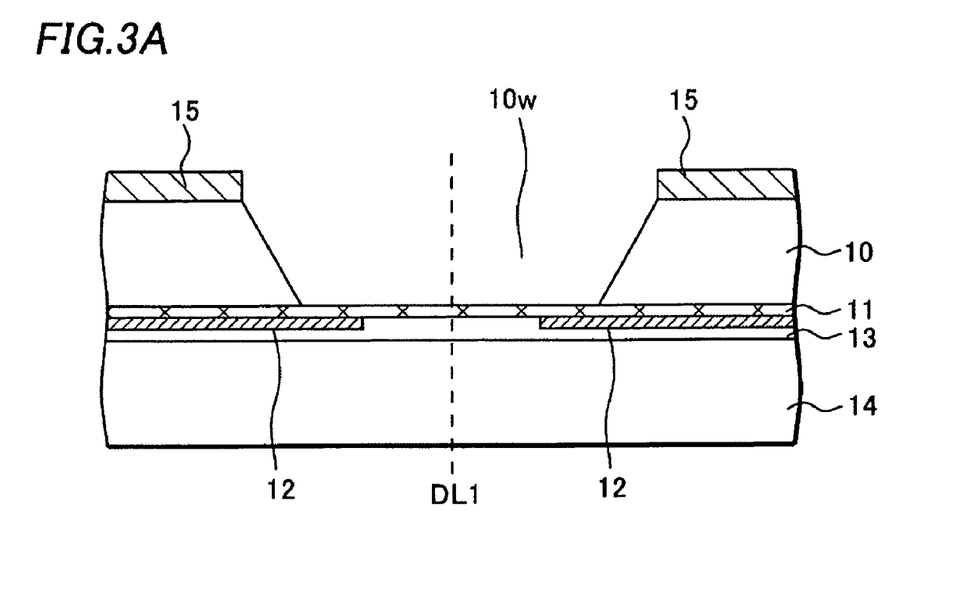
Figure 3B:
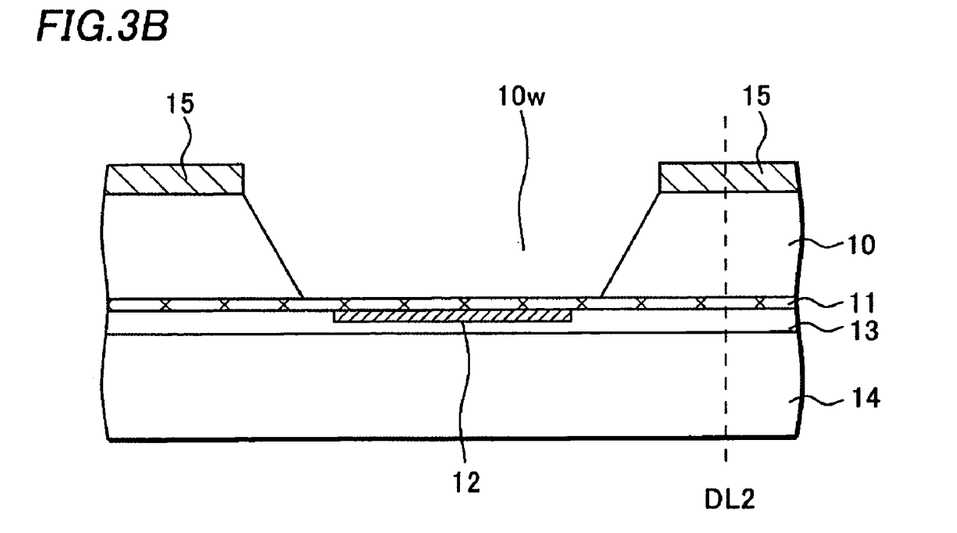

Next, a first resist layer 15 with an opening formed along a part of the dicing line DL1 is formed on the back surface of the semiconductor substrate 10, as shown in FIGS. 3A and 3B. Then, the semiconductor substrate 10 is partially and selectively etched from its back surface by, preferably, isotropic etching using the first resist layer 15 as a mask. By this etching, an opening 10w is formed in the semiconductor substrate 10 along a part of the dicing line DL1. The opening 10w is formed so as to penetrate the semiconductor substrate 10. The first insulation film 11 is exposed at a bottom of the opening 10w. After this etching, the first resist layer 15 is removed. It is noted that this etching can be anisotropic etching.

Actually, a plurality of openings 10w is formed on the semiconductor substrate 10, and its plan view on the back surface of the semiconductor substrate 10 is shown in FIG. 4. It is noted that the pad electrodes 12 are transparently shown in FIG. 4.

As shown in FIG. 4, the plurality of openings 10w is partially formed along the dicing line DL1 on the surface of the semiconductor substrate in regions where the pad electrodes 12 are formed. In regions except the openings 10w, the dicing line DL2 perpendicularly crosses the dicing line DL1.

Figure 5A:
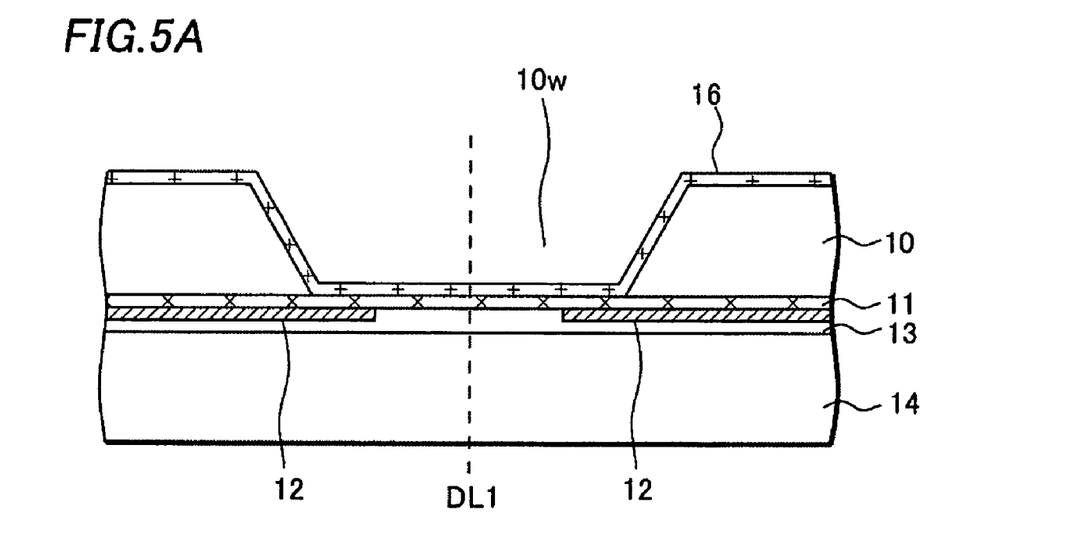
Figure 5B:
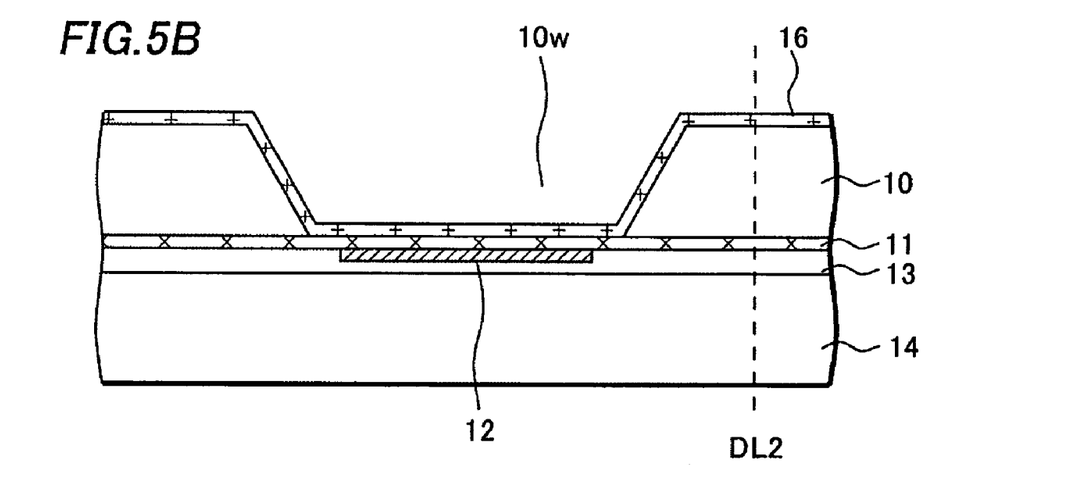

Then, as shown in FIGS. 5A and 5B, a second insulation film 16 is formed as a back surface insulation film on the back surface of the semiconductor substrate 10 including in the opening 10w. The second insulation film 16 is formed of a silicon oxide film ($SiO_2$ film) or a silicon nitride film (SiN film), for example, and formed by a plasma CVD method, for example.

Figure 6A:
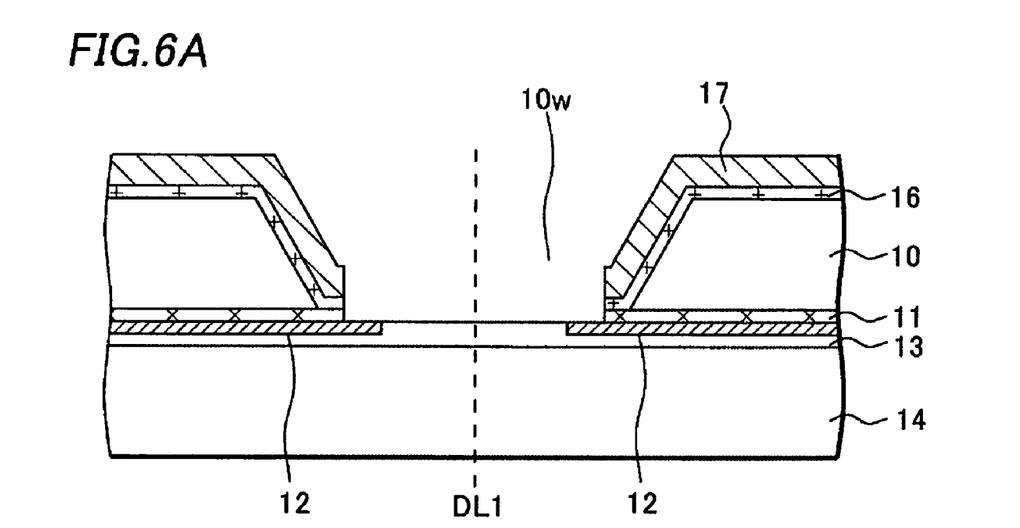
Figure 6B:
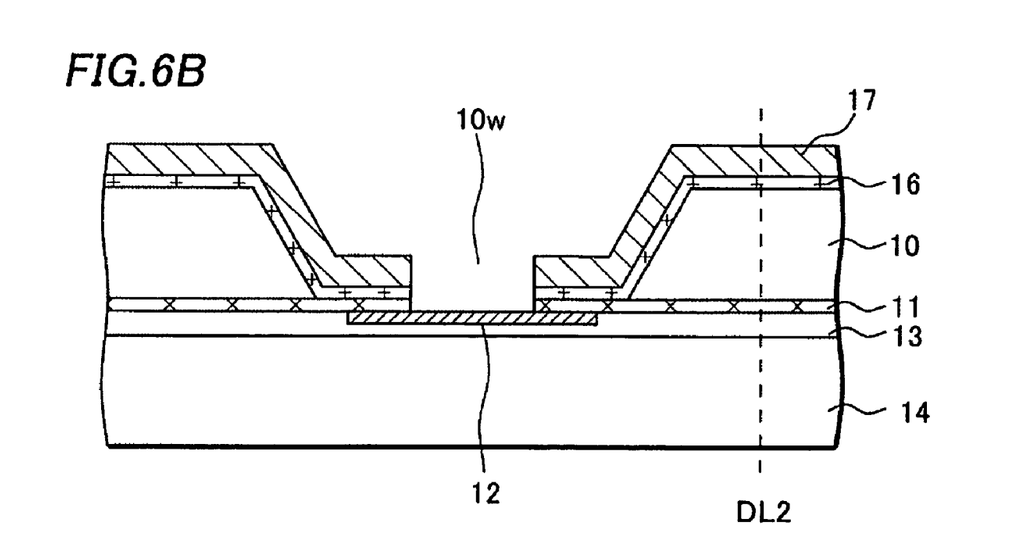

Then, as shown in FIGS. 6A and 6B, a second resist layer 17 is formed on the second insulation film 16, having an opening at the bottom of the opening 10w in a region from above a part of each of the pad electrodes 12 to the dicing line DL1.

Then, by using the second resist layer 17 as a mask, the second insulation film 16 and the first insulation film 11 are etched from the back surface side of the semiconductor substrate 10 by, preferably, anisotropic dry etching. After the etching, the second resist layer 17 is removed. By this etching, the first insulation film 11 and the second insulation film 16 formed in a region from above a part of each of the pad electrodes 12 to the dicing line DL1 are removed. That is, a part of each of the pad electrodes 12 and a part of the resin layer 13 are exposed at the bottom of the opening 10w.

Figure 7A:
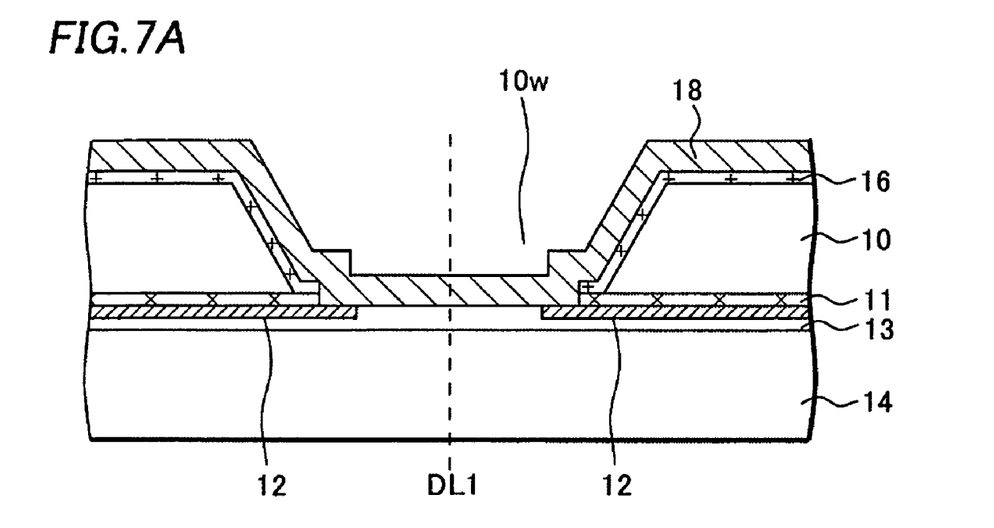
Figure 7B:
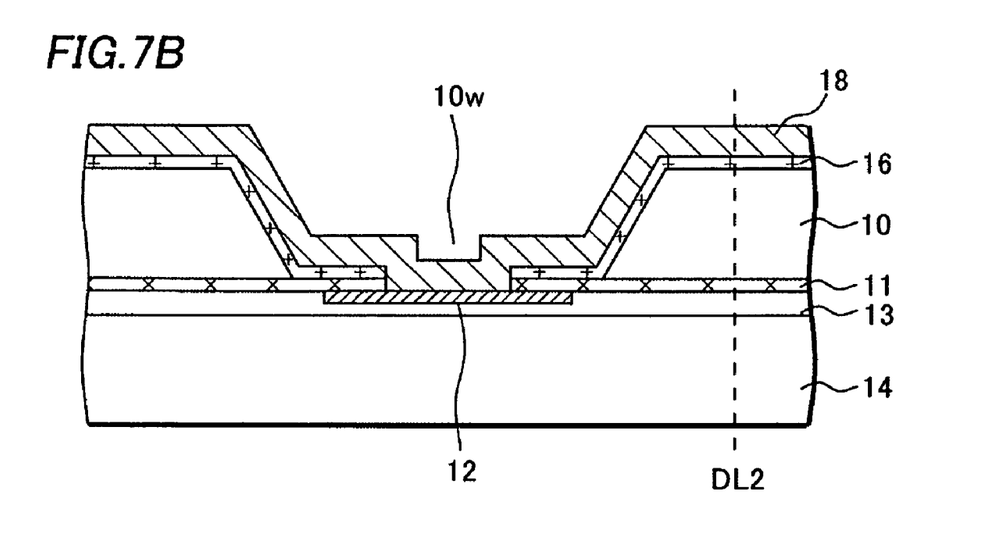

Next, as shown in FIGS. 7A and 7B, a third resist layer 18 as a protection layer is formed on the whole back surface of the semiconductor substrate 10 including in the openings 10w. It is preferable that this third resist layer 18 is formed of a photosensitive organic material for a mask for a photolithography. It is preferable that the third resist layer 18 has thickness of about 10 μm to 30 μm.

Furthermore, it is preferable that the organic material is the one which solidifies keeping predetermined elasticity. For example, the organic material is preferably the one used in a process of forming a buffer layer on the back surface of the semiconductor substrate 10 (so-called a CSM process).

In the conventional process of forming the buffer layer, the organic material is formed on a part of the back surface of semiconductor substrate 10. This buffer layer is to buffer stress applied to a conductive terminal formed on the buffer layer made of the organic material with a wiring layer therebetween. On the other hand, the third resist layer of this embodiment, which is made of the organic material, has a function as a protection layer and is to deal with stress applied to the opening 10w when the semiconductor substrate 10 is handled.

Figure 8A:
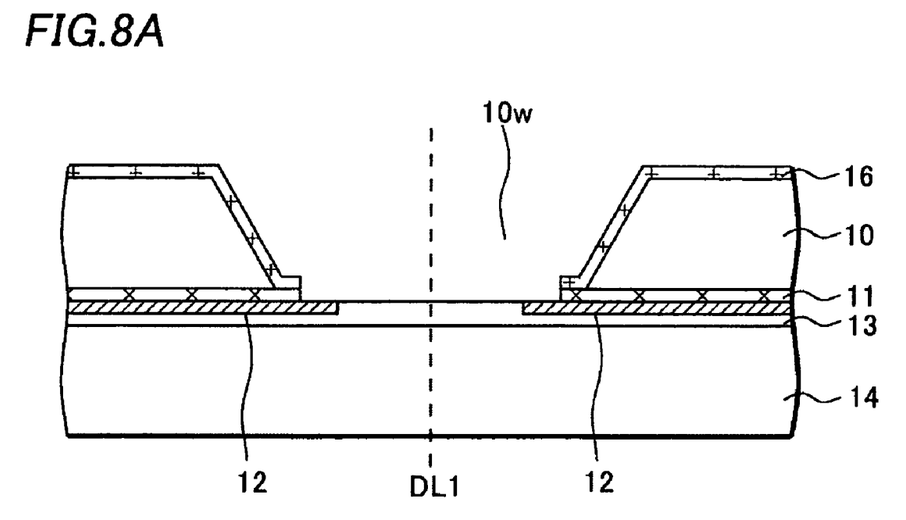
Figure 8B:
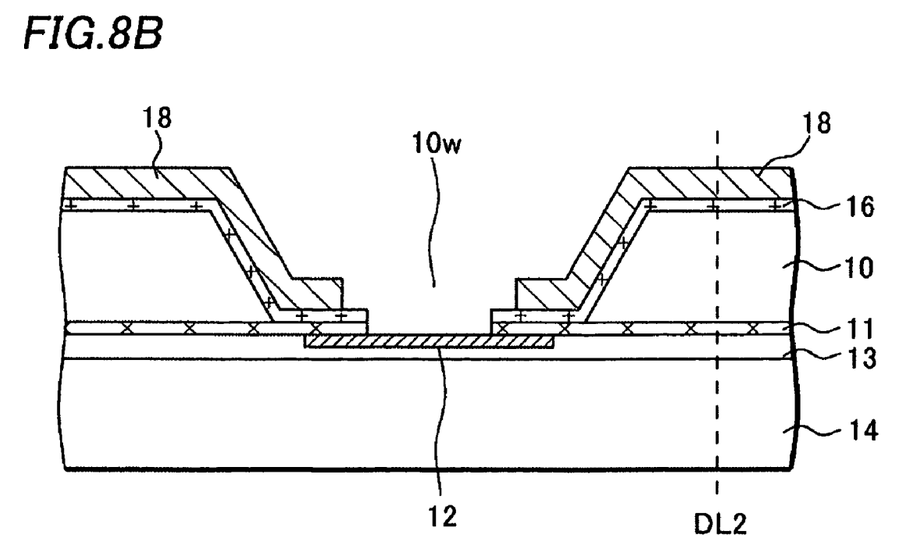

Next, as shown in FIGS. 8A and 8B, the third resist layer 18 is patterned into a predetermined pattern by exposure and development using a mask (not shown). The patterned third resist layer 18 covers part of the second insulation film 16 formed on the back surface of the semiconductor substrate 10, part of the second insulation film 16 formed on the sidewalls of the opening 10w and part of the second insulating film 16 placed on the bottom portion of the opening 10w. As a result, the boundaries between the sidewall of the opening 10w and the bottom of the opening 10w are covered by the patterned third resist layer 18, as shown in FIG. 8B. It is noted that the covered boundaries intersect the dicing line DL1, as shown in the plan view of FIG. 9. The pad electrodes 12 are transparently shown in FIG. 9.

This third resist layer 18 protects the second insulation film 16 near the opening 10w and at the boundaries between the sidewalls and the bottom of the opening 10w, thereby increasing mechanical strength. This can prevent damage such as cracks occurring to the second insulation film 16 at the bottom of the opening 10w by stress applied when the semiconductor substrate 10 is handled, as has been seen in the conventional art.

Furthermore, even if damage such as cracks occurs to the second insulation film 16 at the boundaries between the sidewalls and the bottom of the opening 10w, since the damaged portion is covered with the resist layer 18, a solution such as an etchant or a developer used in subsequent processes can hardly infiltrate into the semiconductor substrate 10, the pad electrodes 12, or the electronic devices (not shown) from the damaged portion.

Furthermore, the described resist layer can be formed by an ordinary process with an organic material used in the conventional process of manufacturing the semiconductor device (e.g. used in the process of forming the buffer layer). Therefore, it is not necessary to add a new particular manufacturing process, thereby preventing a manufacturing cost increasing.

Figure 10A:
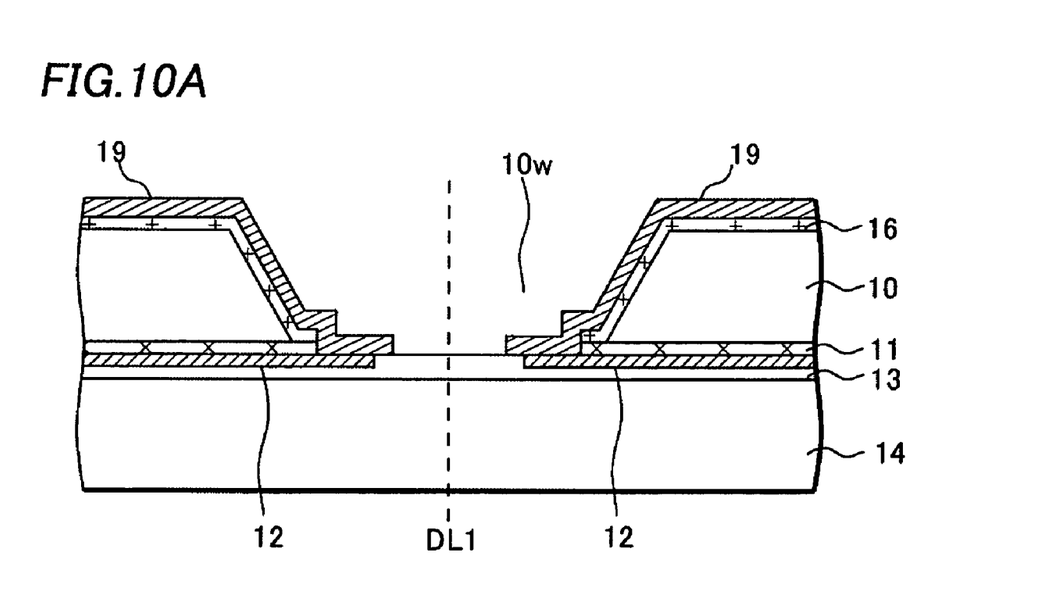
Figure 10B:
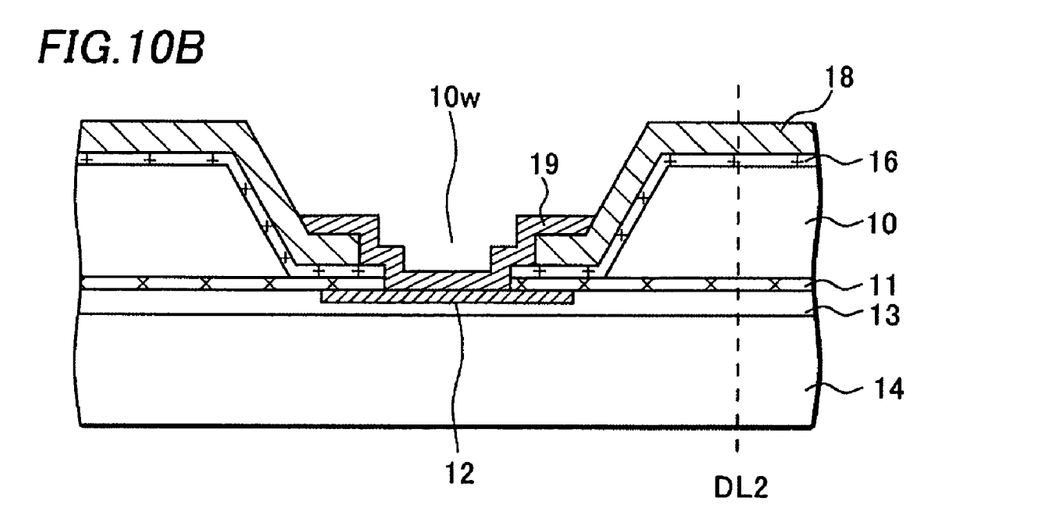

Next, as shown in FIGS. 10A and 10B, a wiring layer 19 is formed along the dicing line DL1 so as to cover a part of each of the pad electrodes 12 and the resin layer 13 exposed in the opening 10w, a part of the second insulation film 16 on the back surface of the semiconductor substrate 10 including in the opening 10w, and a part of the third resist layer 18.

The wiring layer 19 is formed of, for example, aluminum (Al), and formed by a sputtering method, for example. The wiring layer 19 is formed using the resist layer (not shown) as a mask selectively formed on the second insulation film 16 on the back surface of the semiconductor substrate 10, corresponding to a predetermined pattern. The pattern of the wiring layer 19 is shown in the plan view of FIG. 11. It is noted that the pad electrodes 12 are transparently shown in FIG. 11.

The wiring layer 19 can be formed of the other metal than aluminum (Al), and formed by the other method than the sputtering method. Furthermore, the wiring layer 19 does not necessarily cover a part of the resin layer 13.

Figure 12A:
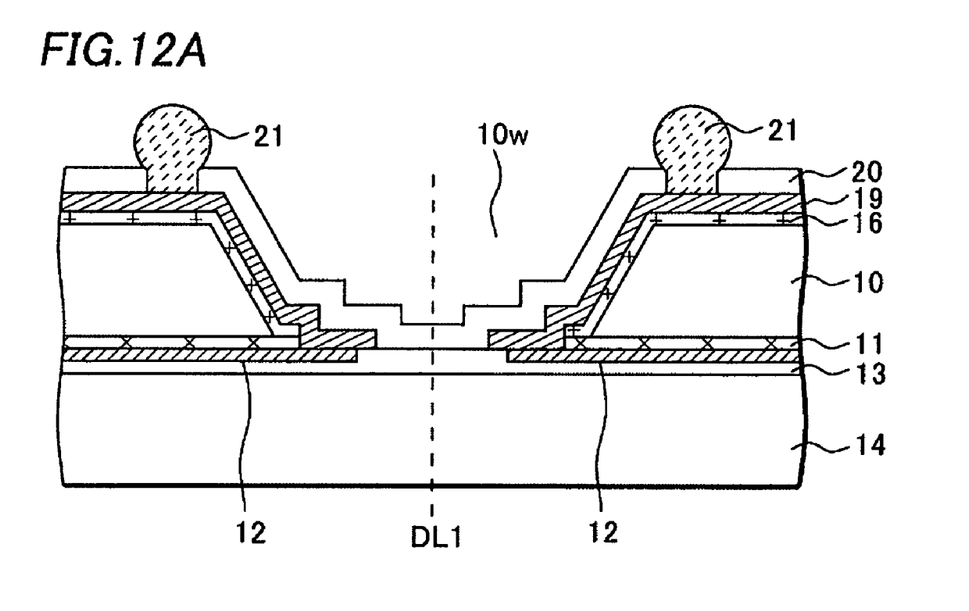
Figure 12B:
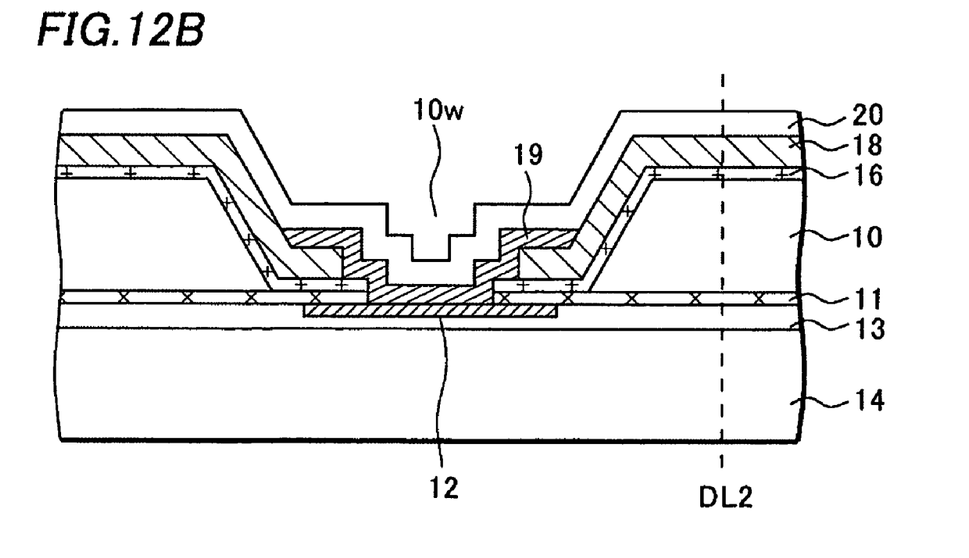

Next, as shown in FIGS. 12A and 12B, a protection layer 20 exposing a part of the wiring layer 19 is formed on the back surface of the semiconductor substrate 10 including on the resist layer 18 and on the wiring layer 19. Furthermore, the conductive terminals 21 formed of, for example, solder are formed on a part of the wiring layer 19 exposed through the protection layer 20.

Figure 13A:
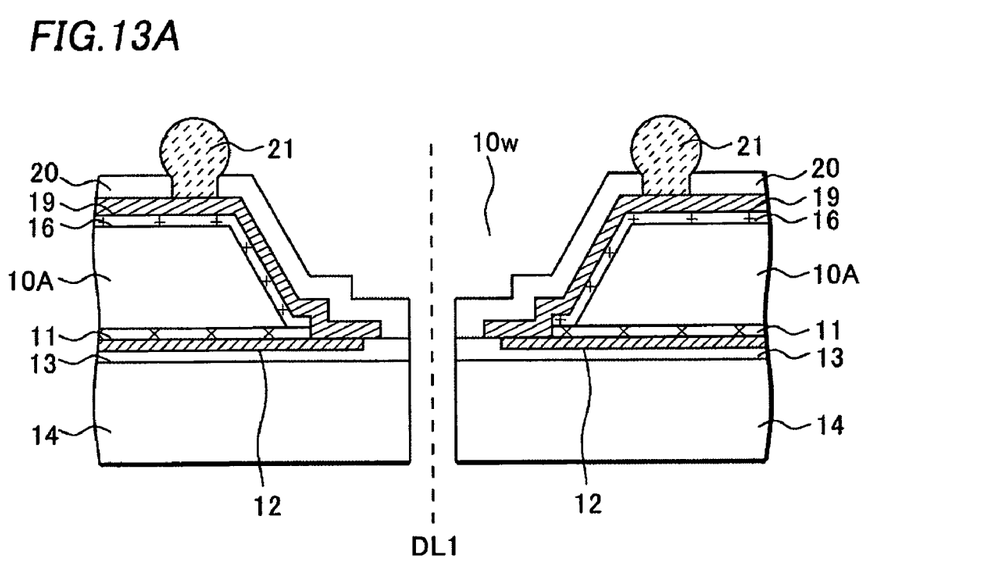
Figure 13B:
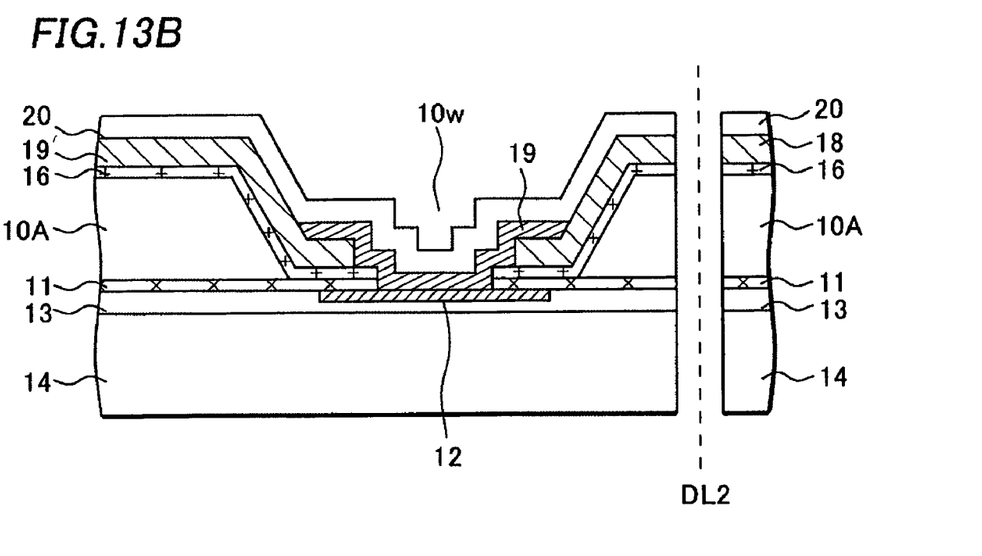

Finally, as shown in FIGS. 13A and 13B, the semiconductor substrate 10 and the layers laminated thereon are separated into a plurality of semiconductor devices each formed of a semiconductor die 10A and layers laminated on the die 10A by dicing along the dicing lines DL1 and DL2.

In the described embodiment, when the third resist layer 18 is patterned into a predetermined pattern, the pattern covers from a part of the second insulation film 16 on the back surface the semiconductor substrate 10 to the second insulation film 16 at the boundaries between the sidewalls and the bottom of the opening 10w, but the invention is not limited to this.

That is, the third resist layer 18 can be formed having a pattern covering the whole surface of the second insulation film 16 on the back surface of the semiconductor substrate 10 and covering the second insulation film 16 at the sidewalls and the bottom of the opening 10w. In this case, only a part of each of the pad electrodes 12 and a part of the resin layer 13 are exposed at the bottom of the opening 10w. Furthermore, the wiring layer in this case is connected with the pad electrodes 12 exposed at the bottom of the opening 10w, and extends onto the described resist layer on the back surface of the semiconductor substrate 10. In this case, the entire second insulation film 16 at the bottom of the opening 10w can be protected.

Although the conductive terminals 21 are formed on the wiring layer 19 in the described embodiment, the invention is not limited to this. That is, the invention can be applied to a semiconductor device formed with no conductive terminal, for example, a LGA (land grid array) type semiconductor device.

In the described embodiment, the wiring layer 19 connected with the pad electrodes 12 is formed on the back surface of the semiconductor substrate 10, the invention is not limited to this. That is, the wiring layer 19 is not be necessarily connected with the pad electrodes 12 as long as it is formed on the semiconductor substrate having a three-dimensional structure like having the opening 10w.

Although the opening 10w is formed so as to penetrate the semiconductor substrate 10 in the embodiment described above, the invention is not limited to this. That is, the opening 10w can form a concave portion on the back surface of the semiconductor substrate 10 without penetrating the semiconductor substrate 10. In this case, the support body 14 formed on the front surface of the semiconductor substrate 10 can be removed in any one of the described processes. Alternatively, the support body 14 can be left without removed, or can be omitted.

Although the opening 10w is formed having an opening on the back surface of the semiconductor substrate 10, and the wiring layer 19 is formed on the back surface including in the opening 10w in the described embodiment, the invention is not limited to this. That is, the opening 10w can be formed on the front surface of the semiconductor substrate 10 and the wiring layer 19 can be formed on the front surface, as long as the support body 14 is not formed thereon.

What is claimed is:

1. A method of manufacturing a semiconductor device, comprising:

providing a semiconductor substrate comprising a front surface, a back surface, a first insulation film disposed on the front surface and a pad electrode disposed on the first insulation film;

attaching a support body to the front surface;

forming an opening in the semiconductor substrate and adjacent the pad electrode by etching the semiconductor substrate from the back surface, the opening having a bottom and a sidewall;

forming a second insulation film that is disposed on the back surface and extends into the opening;

etching the first and second insulation films disposed at the bottom of the opening to expose part of the pad electrode;

forming an organic protection layer that is disposed on the back surface and extends into the opening so as to cover a portion of the second insulation film corresponding to a boundary between the sidewall and the bottom of the opening; and forming a wiring layer that is disposed on the back surface and extends into the opening so as to be in contact with the exposed pad electrode, part of the wiring layer being disposed on the organic protection layer.

2. The method of claim 1, further comprising forming another protection layer on the back surface after the forming of the wiring layer and cutting along a dicing line the semiconductor substrate to produce a semiconductor device comprising the pad electrode.

3. The method of claim 2, further comprising forming a conductive terminal on the another protection layer that is connected to the wiring layer.

4. The method of claim 1, wherein the organic protection layer comprises a resist layer.

5. The method of claim 1, wherein the organic protection layer is in direct contact with the second insulation film.

6. The method of claim 1, wherein the pad electrode is elongated in a first direction, the opening is formed so as to be elongated in the first direction, and the organic protection layer is formed so as to be elongated in a second direction normal to the first direction.

* * * * *